United States Patent
Tai et al.

(10) Patent No.: US 7,684,868 B2
(45) Date of Patent: Mar. 23, 2010

(54) MICROFABRICATED DEVICES FOR WIRELESS DATA AND POWER TRANSFER

(75) Inventors: Yu-Chong Tai, Pasadena, CA (US); Damien C. Rodger, Los Angeles, CA (US); Wen Li, Pasadena, CA (US); Mark Humayun, Glendale, CA (US); James D. Weiland, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 1138 days.

(21) Appl. No.: 11/272,382

(22) Filed: Nov. 10, 2005

(65) Prior Publication Data

US 2006/0121639 A1     Jun. 8, 2006

Related U.S. Application Data

(60) Provisional application No. 60/626,980, filed on Nov. 10, 2004.

(51) Int. Cl.
*A61N 1/40* (2006.01)
(52) U.S. Cl. ......................................................... 607/54
(58) Field of Classification Search .................. 607/54
See application file for complete search history.

(56) References Cited

U.S. PATENT DOCUMENTS

| | | |
|---|---|---|
| 2002/0198573 A1 | 12/2002 | Nisch et al. |
| 2003/0141096 A1 | 7/2003 | Saccomanno |
| 2003/0158588 A1 | 8/2003 | Rizzo et al. |
| 2003/0233134 A1 | 12/2003 | Greenberg et al. |
| 2004/0097003 A1 | 5/2004 | Kocis et al. |
| 2004/0127001 A1 | 7/2004 | Colburn et al. |
| 2004/0186533 A1 | 9/2004 | Greenberg et al. |
| 2004/0229051 A1 | 11/2004 | Schaepkens et al. |

OTHER PUBLICATIONS

Williams, Kirt R. et al. (2003). *Jour of Microelectro Sys*, 12(6)761-778.

*Primary Examiner*—Carl H Layno
*Assistant Examiner*—Yun Haeng Lee
(74) *Attorney, Agent, or Firm*—Joseph R. Baker, Jr.; Gavrilovich Dodd & Lindsey LLP

(57) ABSTRACT

This invention relates to the design and fabrication of micro electromechanical systems (MEMS) for applications in such varied fields as the biomedical, micro-fluidics and chemical analysis fields.

29 Claims, 9 Drawing Sheets

Primary (external) coil

Secondary (internal) coil

Primary (external) coil     Secondary (internal) coil

MICROFABRICATED DEVICES FOR WIRELESS DATA AND POWER TRANSFER

CROSS REFERENCE TO RELATED APPLICATIONS

This application claims priority to U.S. Provisional Application Ser. No. 60/626,980 filed Nov. 10, 2004, the disclosure of which is incorporated herein by reference.

STATEMENTS REGARDING FEDERALLY SPONSORED RESEARCH

The invention was funded in part by Grant Nos. EEC-0310723 awarded by the National Science Foundation and by Grant No. EEC-9402726 awarded by the National Science Foundation. The government may have certain rights in the invention.

TECHNICAL FIELD

This invention relates to micro electromechanical systems (MEMS) for radio-frequency (RF) power and data transfer. The present invention further relates to methods of fabricating of such systems.

BACKGROUND

Micro electromechanical systems (MEMS) have been proposed and demonstrated for applications in such varied fields as the biomedical, micro-fluidics and chemical analysis fields. Biomedical MEMS (bio-MEMS) include implantable components that require the transcutaneous transfer of power and/or data from an external source to an internal source. Transcutaneous energy transfer (TET) may be achieved using inductively coupled radio-frequency (RF) telemetry. Primary (external) and secondary (internal or implanted) RF coils are components of biomedical MEMS devices suitable for uni- and bi-directional TET.

The manufacture of RF coils generally includes mechanically winding metal wires in to coils. However, such techniques are not suitable for the fabrication of coils intended for incorporation in a MEMS-related device. Accordingly, more precise and reproducible mechanisms for the fabrication of devices capable of uni- and bi-directional wireless data and power transfer are needed.

SUMMARY

Provided herein are microdevices fabricated from non-conductive polymeric materials and conductive materials. Systems containing such devices, and methods of manufacturing such devices, are also provided.

In one embodiment, a device that includes a polymeric material and a conductive material that generates an electromotive force when contacted with a modulated magnetic field, or a magnetic field when contacted with an electromotive force, is provided. All or a portion of the conductive material is encapsulated in the polymeric material forming the device. The polymeric material includes the following properties: 1) a dielectric constant of about 2 to 4 at 60 Hz; 2) an elongation break at about 10% to 300%; and 3) a water absorption rate of about 0.01% to 0.10% per 24 hrs. The polymeric material optionally includes the following properties: 4) a tensile strength of about 30 MPa to 80 MPa; and 5) a gas permeability coefficient of about 0.50 to 2000 $cm^3$-mil/100 in 24 hr at 1 atm at 23° C. The gas may be oxygen, nitrogen, carbon dioxide, hydrogen sulfide, sulphur dioxide or chlorine. The gas permeability coefficient for oxygen is less than about 40 $cm^3$-mil/100 in 24 hr at 1 atm and at 23° C. In general, the device is suitable for, but not limited to, implantation in a biological system.

In other embodiments, the device includes a thickness from about 0.05 micron to about 50 microns, or from about 0.1 micron to about 10 microns.

In yet another embodiment, a device provided herein includes multiple layers of a polymeric material and/or multiple layers of a conductive material.

The polymeric material may include at least one of a parylene, an acrylic, a siloxane, xylene, an alkene, styrene, an organosilane, an organosilazane, an organosilicone, a PDMS (poly-di-methyl-siloxane), and polyimide. In some aspects, the parylene is parylene N, parylene C, parylene D, parylene A, parylene AM, parylene F, or parylene HT. The polymeric material may be deposited by a vacuum deposition technique including, but not limited to, plasma deposition, physical vapor deposition, polymer monolithic layer deposition, and spin coating.

In another embodiment, the device includes an conductive material such as a conductive polymer, a metal, a metal oxide, a metal nitride, silicon oxide, silicon nitride, and combinations thereof. In other embodiments, conductive material comprises at least one of platinum, platinum grey, platinum black, gold, iridium, titanium, chromium, copper, aluminum, iridium oxide, chromium oxide, silver oxide, indium zinc oxide, indium tin oxide, silicon oxide, silicon nitride, silicon oxynitride, aluminum oxide, aluminum nitride, aluminum oxynitride, zinc oxide, indium oxide, tin oxide, cadmium tin oxide, cadmium oxide, and magnesium oxide, or combinations thereof.

In some embodiments, the conductive material is deposited by one of plasma deposition, physical vapor deposition, sputtering and electroplating. In other embodiments, the conductive material is deposited by one of plasma enhanced chemical vapor deposition, expanding thermal plasma, microwave plasma, inductively coupled plasma, and high density plasma chemical vapor deposition.

In one embodiment, a device provided herein includes conductive materials and non-conductive polymeric materials to form microdevices, e.g., intraocular or extraocular RF coils.

In another embodiment, a device comprising a plurality of layers of successively deposited material is provided. The deposition of each layer of material includes the deposition of at least a first polymeric material that provides chemical resistance and a barrier to moisture and oxygen. The operation further includes the deposition of at least a second conductive material that supports wireless data and power transmission. In some aspects, the conductive material is completely or partially encapsulated in the polymeric material. The device further includes selectively patterned conductive material. The device also includes polymeric material that is optionally selectively patterned. The device resulting from the deposition and patterning provides at least one structure that can function as a radio-frequency coil.

In another embodiment, a system including a first element comprising a device as described above, an electrode having a first end operably linked to the first element and a second end operably linked to an array, and a second element inductively linked to the first element, is provided. The second element includes a mechanism for generating a magnetic field that contacts the first element and a mechanism for generating RF telemetry that contacts the first element.

In one embodiment, the first element of the system is implanted in biological system, such as an eye. In some aspects, the device included in the first element includes a coil that receives data and/or power from the second element. The coil can be an intraocular or extraocular coil. In other embodiments, the first element further includes an integrated circuit that processes data received by the device.

In yet another embodiment, the second element is external to the biological system. In some aspects, the second element is a transmitter comprising a coil.

In one embodiment, the electrode includes a second end operably linked to an array. As used herein, an array can be any electrode contact point that accepts a signal from the electrode. Thus, the term "array" encompasses a retinal array associated with ocular tissue, such as nerve tissue associated with the retina of an eye, or other MEMS components integrated with the first and second element of the system. The first element may include an amplifier that amplifies a signal received from the second element and transmitted to the electrode for relay to an array.

In yet another embodiment, a method for manufacturing a multilayer device is provided. The method includes forming at least one layer of polymeric material on a solid substrate that may include one or more previously deposited layers of one or more materials. In some aspects, the polymeric material provides chemical resistance and provides a barrier to moisture and oxygen. The method further includes forming at least one layer of conductive material on a solid substrate that may include one or more previously deposited layers of one or more materials. In some aspects, the conductive material supports wireless data and/or power transmission. The method further includes selectively patterning the conductive material, and optionally selectively patterning the polymeric material. In some aspects, the operation of depositing and patterning can be repeated one or more times to build up a three-dimensional structure from a plurality layers. The method further includes removing the solid substrate. The resulting multilayer device is mechanically flexible. In addition, the conductive material is completely or partially encapsulated in the polymeric material.

In some embodiments, the polymeric material includes the following properties: a dielectric constant of about 2 to 4 at 60 Hz; an elongation break at about 10% to 300%; and a water absorption rate of about 0.01% to 0.10% per 24 hrs. In other embodiments, the polymeric material comprises the following properties: a tensile strength of about 30 MPa to 80 MPa; and a gas permeability coefficient of about 0.50 to 2000 $cm^3$-mil/100 in 24 hr at 1 atm at 23° C.

In one embodiment, the conductive material generates an electromotive force when contacted with a modulated magnetic field. In other embodiments, the conductive material generates a magnetic field when contacted with an electromotive force.

In some embodiments, the conductive material includes at least one of a conductive polymer, a metal, a silicon derivative, or combinations thereof. In some aspects, the conductive material includes at least one of a platinum, platinum grey, platinum black, gold, iridium, titanium, chromium, copper, aluminum, iridium oxide, chromium oxide, silver oxide, indium zinc oxide, indium tin oxide, silicon oxide, silicon nitride, silicon oxynitride, aluminum oxide, aluminum nitride, aluminum oxynitride, zinc oxide, indium oxide, tin oxide, cadmium tin oxide, cadmium oxide, magnesium oxide, and combinations thereof.

In other embodiments, the conductive material is formed by one of plasma deposition, physical vapor deposition, sputtering, or electroplating. In some aspects, the plasma deposition is plasma enhanced chemical vapor deposition, expanding thermal plasma, microwave plasma, inductively coupled plasma, or high density plasma chemical vapor deposition.

In other embodiments, the conductive material is patterned by a liquid reagent or a gaseous reagent. In some aspects, the gaseous reagent is plasma.

In some embodiments, the solid substrate is comprised of silicon, glass, steel, quartz, soda lime or Teflon, or derivatives thereof. In some aspects, the silicon is low expansion titanium silicate.

In other embodiments, the polymeric material includes at least one of a parylene, an acrylic, a siloxane, xylene, an alkene, styrene, an organosilane, an organosilazane, an organosilicone, a PDMS (poly-di-methyl-siloxane) or a polyimide. In some aspects, the parylene is parylene N, parylene C, parylene D, parylene A, parylene AM, parylene F, parylene HT, or combinations thereof.

In one embodiment, the polymeric material layer is formed by one of plasma deposition, physical vapor deposition, polymer monolithic layer deposition, or spin coating.

In other embodiments, the polymeric material is patterned by a plasma liquid reagent, a gaseous reagent, laser ablation, or blade cutting.

In other embodiments, a method of manufacturing a device of the invention further includes heat treating the multilayer device to conform to a region of implantation in a biological environment.

In one embodiment, methods of manufacturing devices of the invention include metal-etch fabrication processes. In other embodiments, the methods include lift-off fabrication processes.

In one embodiment, a method for manufacturing a device is provided. The method includes: 1) providing a solid substrate; 2) optionally depositing a first resist layer on the substrate; 3) depositing a first layer of polymeric material on the first resist layer or the substrate; 4) depositing a first layer of conductive material on the first layer of polymeric material; 5) depositing a second resist layer on the conductive material and patterning the resist; 6) transferring the pattern to the first layer of conductive material forming a patterned conductive material is formed; 7) depositing a second layer of polymeric material on the patterned conductive material; and 8) removing the solid substrate.

In another embodiment, a method of manufacturing a device of the invention may further include, prior to removal of the solid substrate: 1) depositing a third resist layer on the second layer of polymeric material, patterning the resist, and transferring the pattern to the second layer of polymeric material; 2) depositing a second layer of conductive material on the second layer of polymeric material; 3) depositing a fourth resist layer on the conductive material and patterning the resist; 4) transferring the pattern to the second layer of conductive material forming a patterned conductive material; 5) depositing a third layer of polymeric material on the patterned conductive material; and 6) removing the solid substrate.

In some embodiments the solid substrate includes silicon, or derivatives thereof such as low expansion titanium silicate. In other embodiments, the solid substrate can be glass, steel, quartz, soda lime or Teflon.

In another embodiment, a resist layer can be patterned by a liquid reagent or a gaseous reagent. The gaseous reagent can be, for example, plasma.

In yet another embodiment, methods of the invention further comprise heat treating the microdevice to conform to a region of implantation in a biological environment.

In another embodiment, provided herein are devices manufactured by a method of the invention.

The details of one or more embodiments of the disclosure are set forth in the accompanying drawings and the description below. Other features, objects, and advantages will be apparent from the description and drawings, and from the claims.

BRIEF DESCRIPTION OF DRAWINGS

Like reference symbols in the various drawings indicate like elements.

DETAILED DESCRIPTION

As will be described in more detail below, a device that includes an polymeric material and a conductive material that generates an electromotive force when contacted with a modulated magnetic field, or alternatively generates a magnetic field when contacted with an electromotive force, is provided. Systems containing the device and methods of manufacturing the device are also provided.

Figure 1:
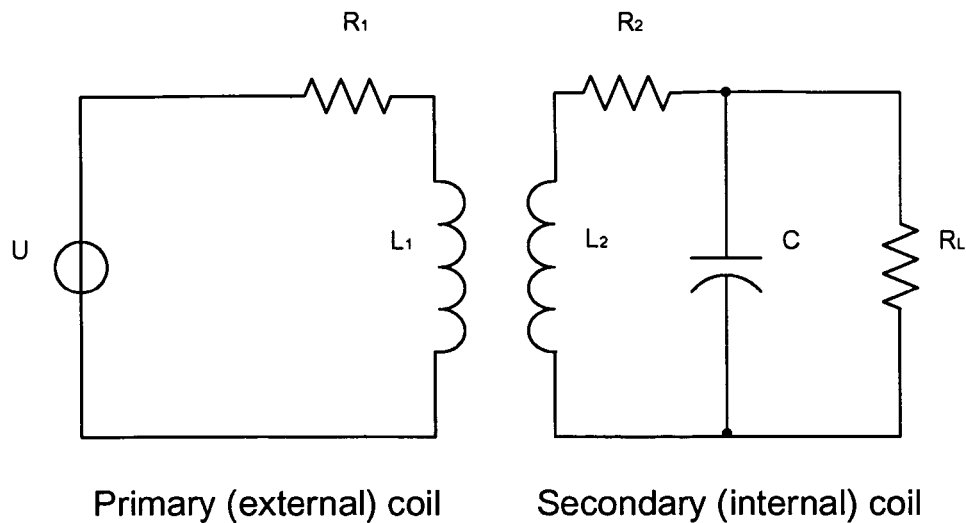
FIG. 1 depicts an electromagnetically coupled power system.

Referring to FIG. 1, the devices and systems provided herein are designed for use with wireless power and data transmission. An electromagnetically coupled power system is implemented in practice through the use of an inductive link, which is effectively a weakly coupled coreless transformer.

In one embodiment, a device of the invention is a transceiver that includes a secondary coil suitable for receiving power and data from an external source. Optionally, the device may transmit data to the an external source. To optimize the power transfer system, the secondary coil may be designed to have high inductance (L2) and low resistance (R2). Exemplary equations for implementation of a device of the invention are given as:

$$R = \rho \frac{L}{A_c},$$

$$V = -\frac{d\Phi}{dt} = -NA\frac{dB}{dt} = -NA\mu_0 H_{amp}\omega,$$

$$L_2 = 2\pi dN^2 \times 10^{-9}\left[\left(\ln\frac{4d}{t}\right)\left(1 + \frac{t^2}{24d^2}\cdots\right) - \frac{1}{2} + \frac{43t^2}{288d^2}\cdots\right] \text{(Henries)},$$

R is the coil resistance, $\rho$ is the resistivity, L is the total coil length, $A_c$ is the cross section of the coil, N is the number of turns, A is the projective coil area, $\mu_o$ is the vacuum permeability, $H_{amp}$ is the magnetic field amplitude, $\omega$ is the angular frequency of the AC signal (i.e., $2\pi \times 1$ MHz for the current system), $L_2$ is the secondary coil inductance, d (in cm) is the diameter of the coil, and t (in cm) is the coil width.

Figure 2A:
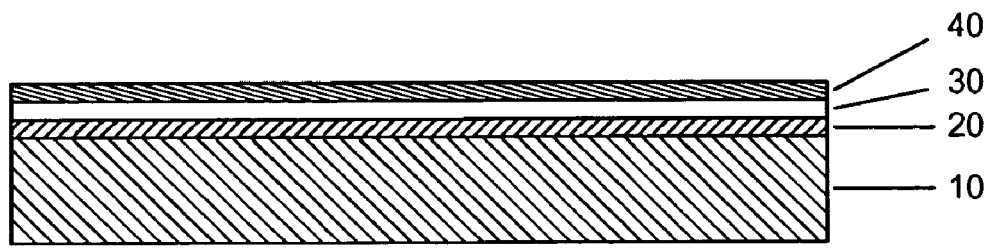
FIG. 2A through FIG. 2L depict a method of manufacturing a device of the invention by metal etch fabrication.
Figure 2B:
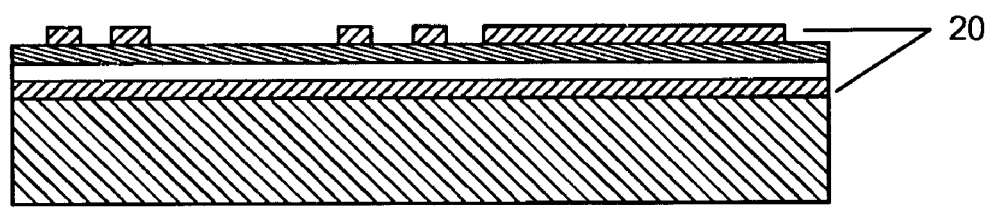
Figure 2C:
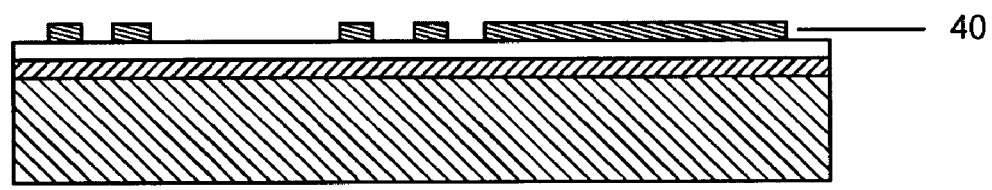
Figure 2D:
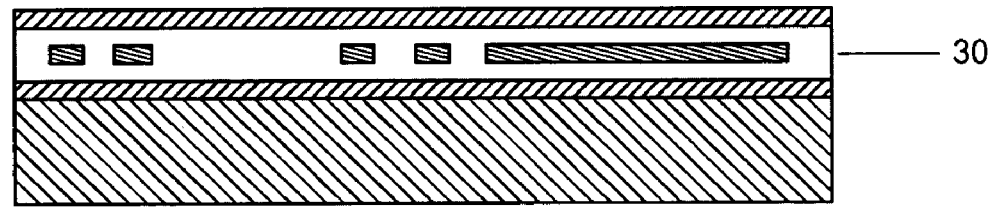
Figure 2E:
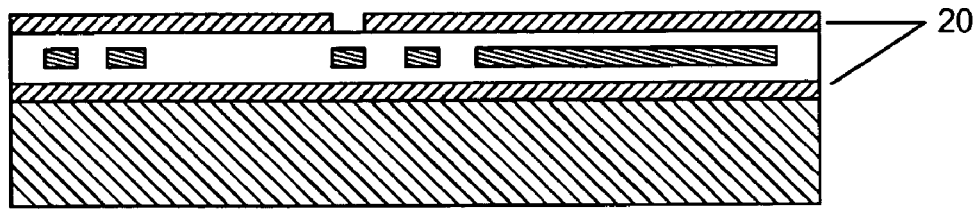
Figure 2F:
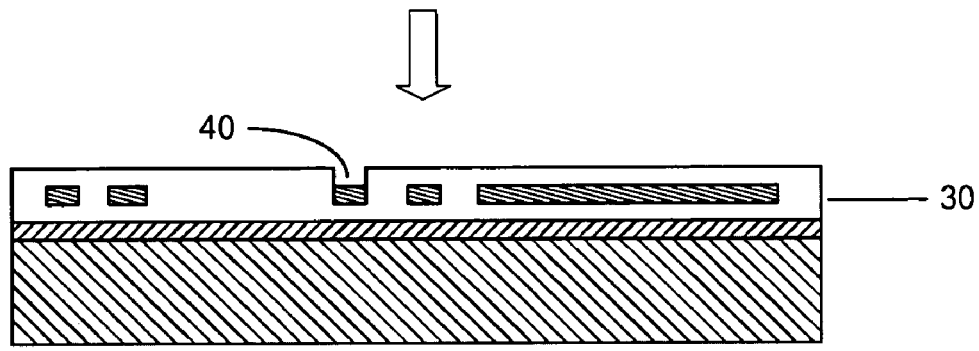
Figure 2G:
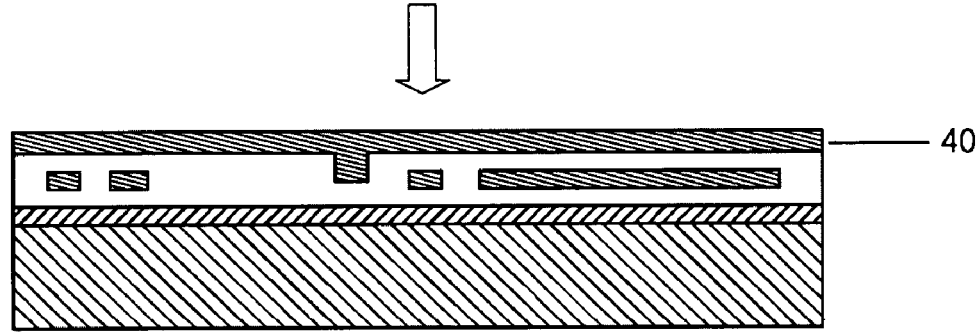
Figure 2H:
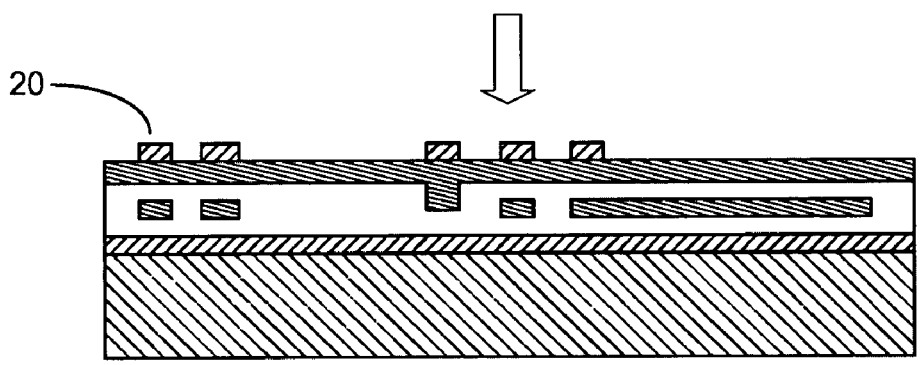
Figure 2I:
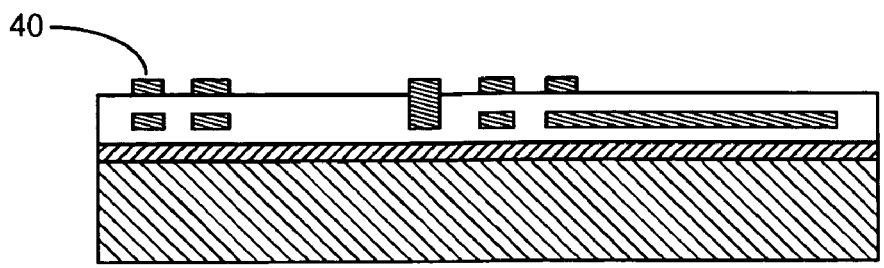
Figure 2J:
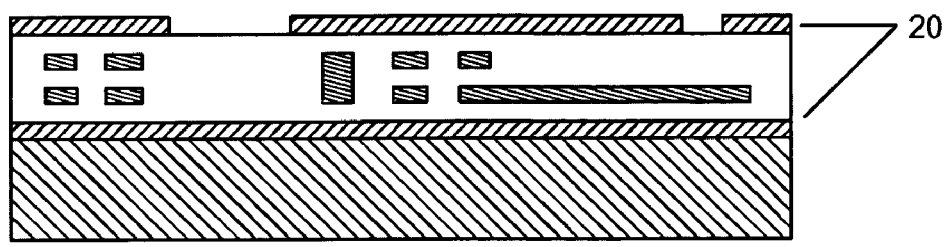
Figure 2K:
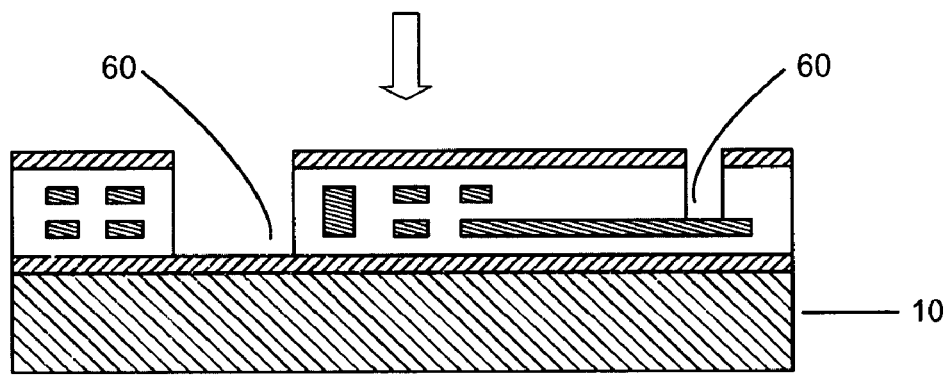
Figure 2L:
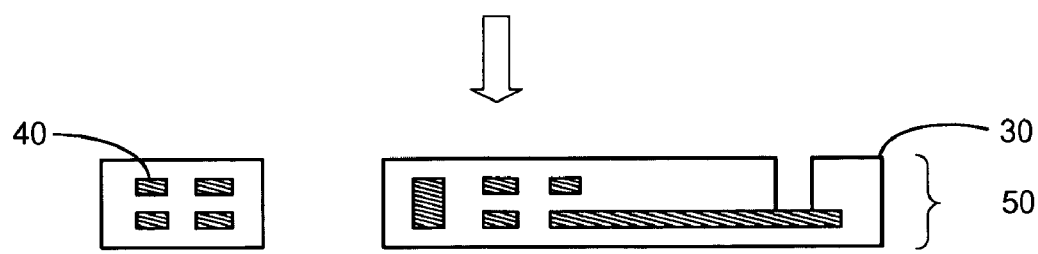
Figure 3A:
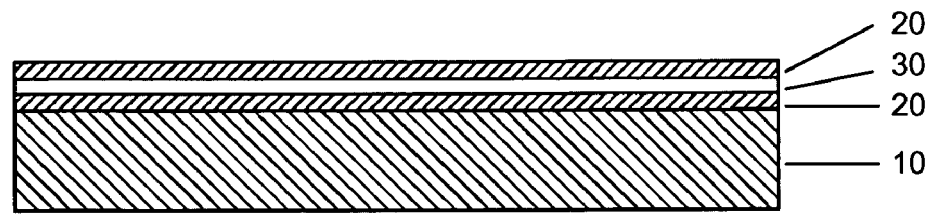
FIG. 3A through FIG. 3P depict a method of manufacturing a device of the invention by lift-off fabrication.
Figure 3B:
Figure 3B:
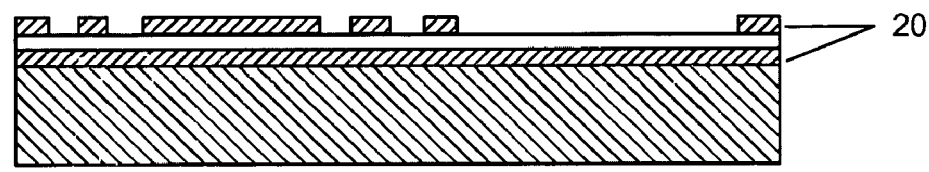
Figure 3C:
Figure 3C:
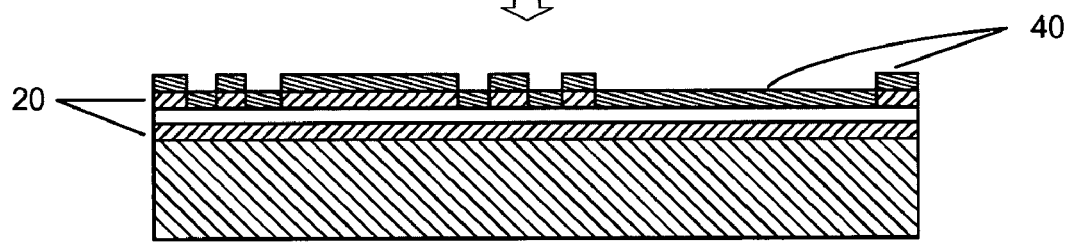
Figure 3D:
Figure 3D:
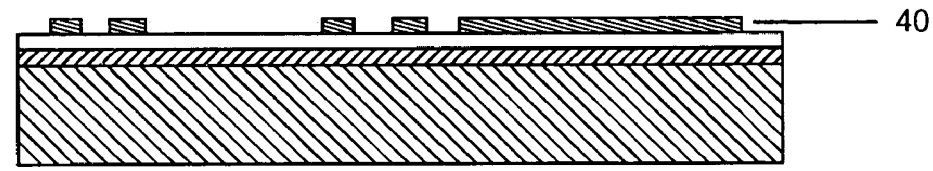
Figure 3E:
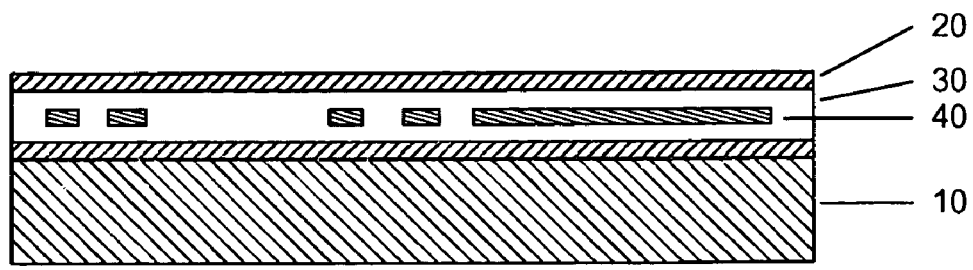
Figure 3F:
Figure 3F:
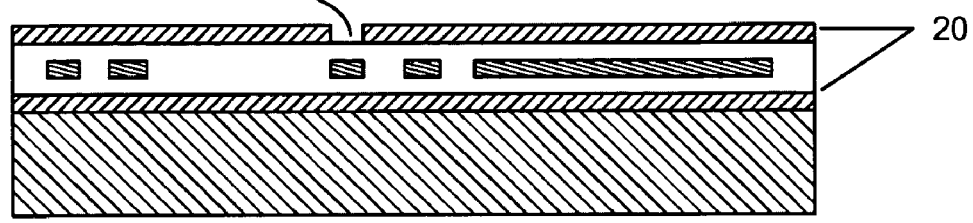
Figure 3G:
Figure 3G:
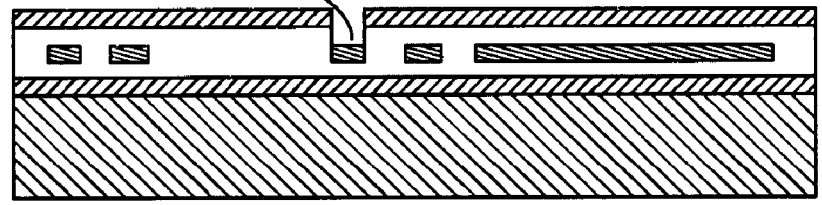
Figure 3H:
Figure 3H:
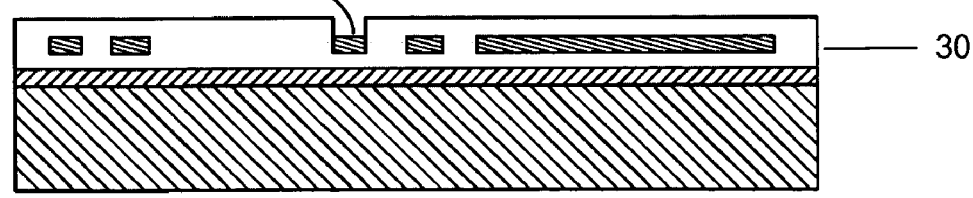
Figure 3I:
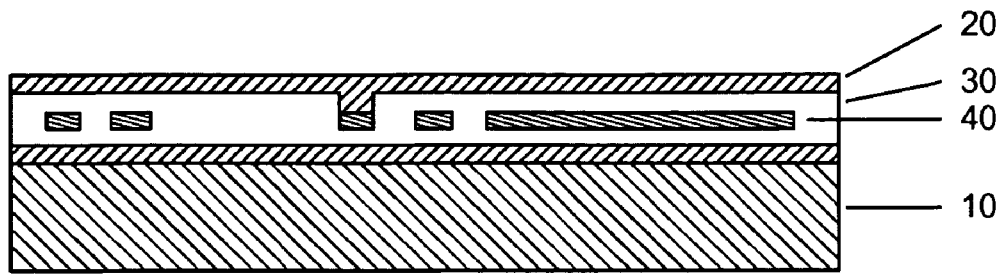
Figure 3J:
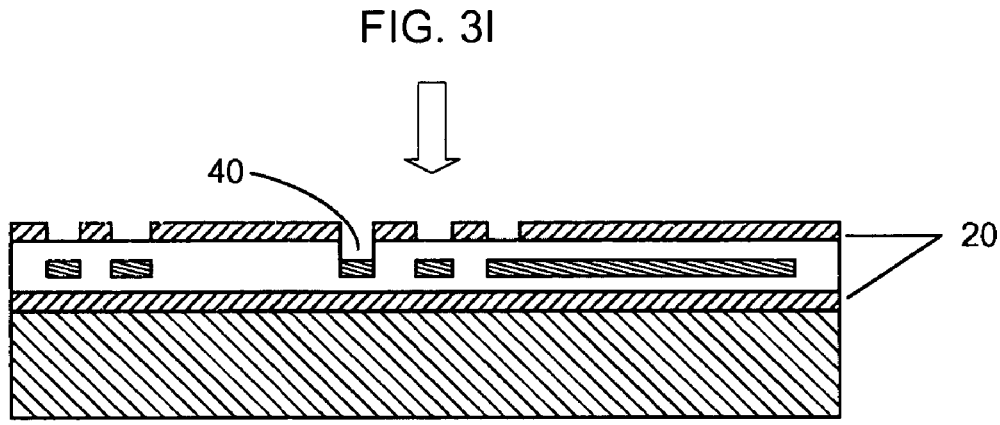
Figure 3K:
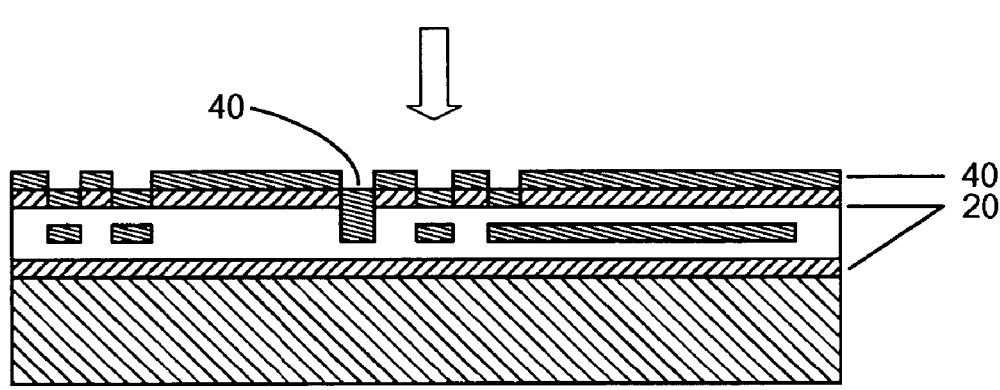
Figure 3L:
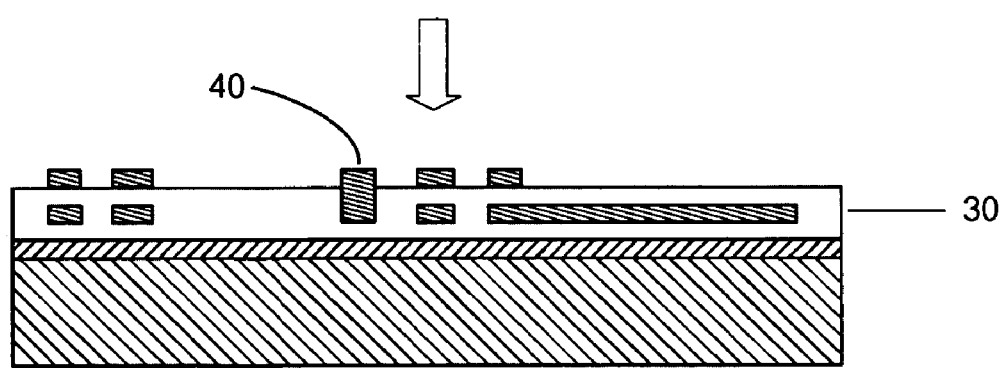
Figure 3M:
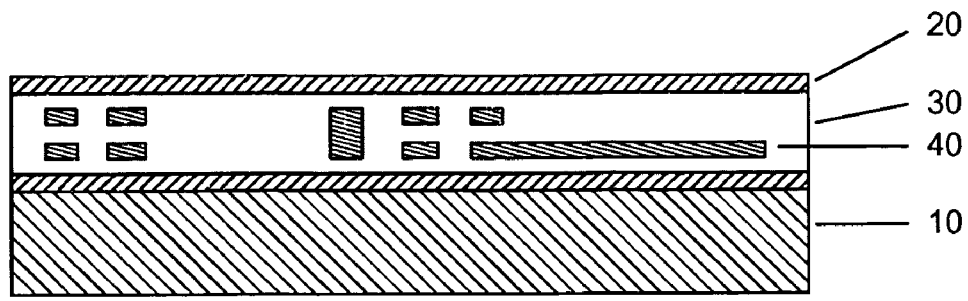
Figure 3N:
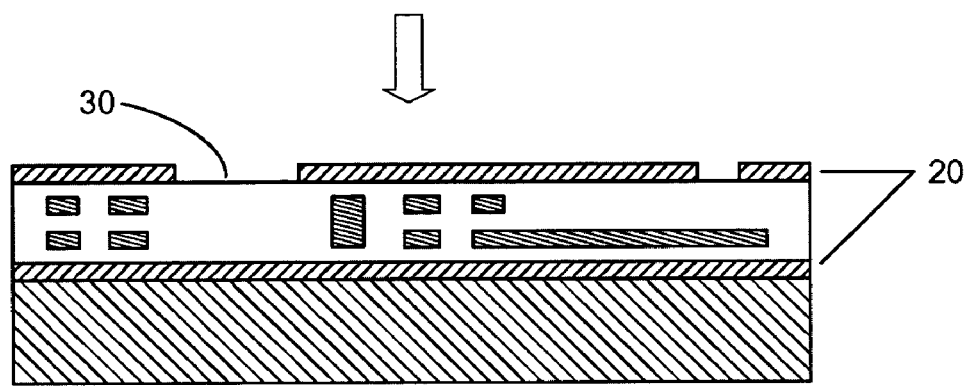
Figure 3O:
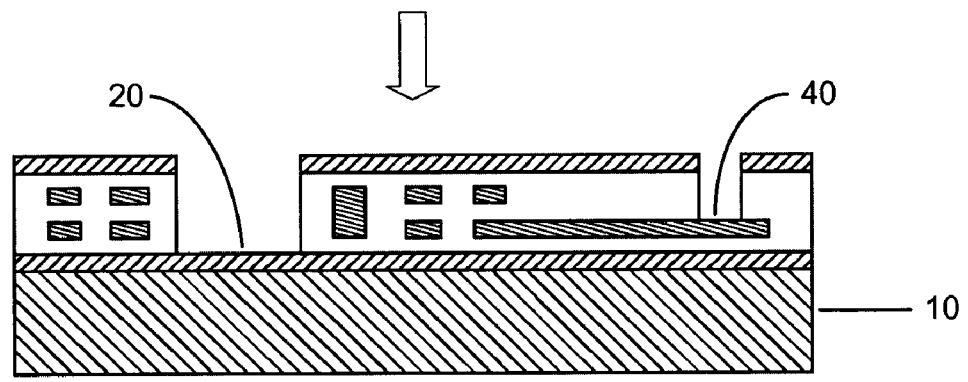
Figure 3P:
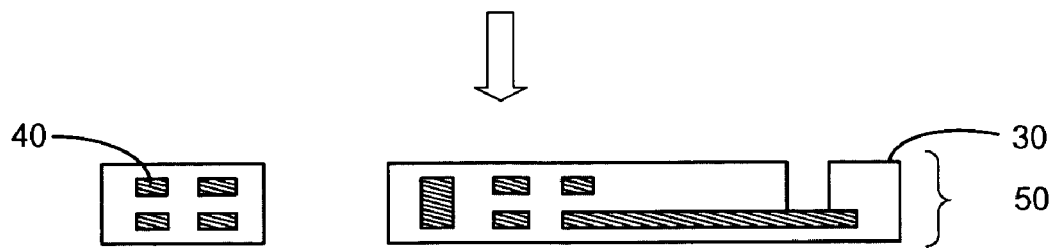

Referring to FIG. 2L and FIG. 3P, a device 50 that includes a non-conductive polymeric material 30 and a conductive material 40 that generates an electromotive force when contacted with a modulated magnetic field, or generates a magnetic field when contacted with an electromotive force, is provided. The conductive material is encased in the polymeric material forming the device. The polymeric material of the device serves to isolate the conductive layer from exposure to biological environments containing corrosive substances, such as salt, and the like. Such external elements can cause the destruction and degradation of the conductive layer over time through tarnishing, breakdown, or delamination, resulting in the loss of its conductivity.

In accordance with the present invention, non-conductive polymeric materials can be applied in layers through a coating process using conventionally known vapor phase deposition or vacuum evaporation deposition techniques. It is understood that the present invention can utilize any suitable commercially available method for applying a polymeric to a surface as known by one skilled in the art. The deposition process can be repeated at least once using the same or a different polymeric material (e.g., parylene N, parylene C, parylene D, parylene A, parylene AM, parylene F, parylene HT, and/or mixtures thereof) to produce a multilaminate polymeric coating. Exemplary deposition techniques include plasma deposition, physical vapor deposition, polymeric monolithic layer deposition, and spin coating. Also included are plasma enhanced chemical vapor deposition, expanding thermal plasma, microwave plasma, inductively coupled plasma, and high density plasma chemical vapor deposition.

A "non-conductive polymeric material," as used herein, is defined as a material composed of large molecules that have been formed from the chemical bonding of smaller units (monomers). In addition, the material possesses a low K dielectric. Examples of low K dielectric materials include, fluorine-doped silicate glass (FSG), xerogels and other porous oxide materials, silsesquioxanes, organosilicates, parylene, fluorinated materials, among other low K dielectrics. The dielectric strength of an insulating material is the maximum electric field strength that it can withstand intrinsically without breaking down, i.e., without experiencing failure of its insulating properties.

In general, the polymeric material possesses chemical and physical properties consistent with biocompatibility and flexibility, and is suitable for micromachining. Such properties may include a dielectric constant of about 1 to 5, 2 to 4, or about 3 at 60 Hz. An elongation-at-break of about 1% to 500%, 5% to 400%, 10% to 300%, or about 200%. A water absorption rate of about 0.001% to 2%, 0.01 to 0.1%, or about 0.01% to 0.10% per 24 hrs. A tensile strength of about 1 MPa to 100 MPa, 30 MPa to 90 MPa, or about 50 MPa to 80 MPa. A gas permeability coefficient of about 0.10 to 2000, 0.20 to 100, or about 0.3 to 10 $cm^3$-mil/100 in 24 hr at 1 atm at 23° C. The gas may be oxygen, nitrogen, carbon dioxide, hydrogen sulfide, sulphur dioxide or chlorine. For example, the polymeric material may possess a gas permeability coefficient for oxygen of about 1 to 10, 2 to 9, 4 to 8, or about 7 $cm^3$-mil/100 in 24 hr at 1 atm and at 23° C. In general, the device is suitable for, but not limited to, implantation in a biological system.

Additional properties of the polymeric material optionally include a moisture vapor transmission rate of less than about 2.0, 1.0, or about 0.5 g-mil/100 in 24 hr at 90% relative humidity and 37° C.

Exemplary polymeric material includes flexible polymerics such as parylene polymeric, acrylic, siloxane, xylene, alkene, styrene, organosilane, organosilazane, organosilicone, PDMS (poly-di-methyl-siloxane), and polyimide. Polyimide is widely used in electrical ribbon interconnects, because of its heat tolerance, mechanical strength, and chemical stability. PDMS is chemically similar to various forms of silicone rubber that exhibit high chemical stability. Parylene is a material that is commonly deposited conformally using plasma deposition and thus can coat any contour with a thin film that has properties similar to that of a plastic bag. Parylenes are chemically inert, biocompatible, flexible and have a relatively low gas permeability. Parylene polymers include parylene N, parylene C, parylene D, parylene A, parylene AM, parylene F, parylene HT, or combinations or mixtures thereof. For example, a parylene polymeric layer can be composed of an interpolyme of monomers of parylene variants of varying mixture ratios. The thickness of the parylene polymer layer may range from a few thousand angstroms to about 75 microns. More specifically, a parylene polymer layer can be about 0.0001 micron, 0.001 micron, 0.01 micron, 0.1 micron, or 1 micron to about 75 microns. It is noted that the actual thickness of and the mixture ratios of the variants in the parylene polymer layer can be adjusted according to the application, requirements, the conductive component used, the desired effect, the duration of effect, and the types of expected contaminant exposures and the like, and may be readily determined by one skilled in the art.

A device of the invention manufactured with an polymeric material provided herein can be optionally processed using suitable annealing or heat-treatment techniques to improve the chemical resistance and durability of the polymeric material. The term "annealing" or "heat-treating" as used herein refers to any processes for treating a substance or material with heat followed by cooling to modify or alter the structural properties of the treated substance or material. The device may be fashioned such that it conforms to the shape of the tissue in which implantation will occur. For example, the device may be fabricated to include a concave shape so that it conforms to the foveal pit of an eye.

Referring again to FIG. 2L and FIG. 3P, a device 50 of the invention further includes a conductive material 40 that receives power/and or data from an external source by inductively coupled radio-frequency (RF) telemetry. Thus, the conductive material 40 generates an electromotive force when contacted with a modulated magnetic field. Alternatively, the conductive material 40 generates a magnetic field when contacted with an electromotive force. The conductive material can include at least one of a conductive polymer, a metal, a metal oxide, a metal nitride, silicon oxide, silicon nitride, and combinations thereof. Exemplary metals include chromium oxide, silver oxide, indium zinc oxide, indium tin oxide, silicon oxide, silicon nitride, silicon oxynitride, aluminum oxide, aluminum nitride, aluminum oxynitride, zinc oxide, indium oxide, tin oxide, cadmium tin oxide, cadmium oxide, platinum, platinum grey, platinum black, gold, iridium, titanium, chromium, copper, aluminum, iridium oxide, magnesium oxide and combinations thereof.

As previously noted, an electromagnetically coupled power system is implemented in practice through the use of an inductive link, which is effectively a weakly coupled coreless transformer. A transformer is an electrical device that transfers energy from one electrical circuit to another by magnetic coupling without moving parts. Referring to FIG. 1, a single phase(1φ) transformer generally includes two electrical conductors called the primary coil (external) and the secondary coil (internal). The primary is fed with a varying (alternating or pulsed direct current) electric current which creates a varying magnetic field around the conductor. According to the principle of mutual inductance, the secondary, which is placed in this varying magnetic field, will develop a potential difference called an electromotive force (EMF). If the ends of the secondary are connected together to form an electrical circuit, this EMF will cause a current to flow in the secondary. Thus, some of the electrical power fed into the primary is delivered to the secondary.

In general, the primary and secondary conductors can be in a "coil" because such a configuration creates a dense magnetic field (high magnetic flux) in contrast to a straight conductor. However, it is understood that devices provided herein are not limited solely to a "coil" configuration for the conductive material. For example, a device may include a conductive material that possesses the attributes necessary to operate as a "secondary coil," as described above, without actually maintaining a "coil" configuration. Such configurations, while generally circular, also include oval, square, rectangular, or any other configuration suitable for supporting RF data and/or power transfer via inductance. The devices provided herein are suitable for manufacture using techniques and equipment ordinarily used in the manufacture of integrated circuits (IC) and other MEMS devices. Similar to an IC, the structure of a device of the invention is limited only by the material used to manufacture the device and the techniques used to deposit and pattern such material. Accordingly, methods provided herein may be used to manufacture devices that include conductive material in a "non-coil" arrangement yet retain the functionality of a conventional hand-wound coil.

A device of the invention may include multiple layers of a polymeric material and multiple layers of a conductive material. In view of the methods provided herein, the skilled artisan can readily determine the number and thickness of layers necessary to form a device suitable for receiving data a power from another source. In general, the device can have a thickness from about 0.05 micron to about 50 microns, or from about 0.1 micron to about 100 microns.

Accordingly, a device comprising a plurality of layers of successively deposited material is provided. The deposition of each layer of material includes the deposition of at least a first polymeric material that provides chemical resistance and provides a barrier to moisture and oxygen and the deposition of at least a second conductive material that supports wireless data and power transmission. In some aspects, the conductive material is completely or partially encapsulated in the polymeric material. The device further includes selectively patterned conductive material. The device also includes polymeric material optionally selectively patterned. The device resulting from the deposition and patterning provides at least one structure that can function as a radio-frequency (RF) coil.

Devices of the invention can be included in any system that requires the wireless transfer of power and/or data. Accordingly, a system including a first element comprising a device as described above, an electrode operably linked to the first element, and a second element inductively linked to the first element, is provided. The second element includes a mechanism for generating a magnetic field that contacts the first element and a mechanism for generating RF telemetry that contacts the first element, or a mechanism for generating an electromotive force when contacted by a magnetic field from the first element.

Referring to FIG. 1, the primary (external) coil provides an exemplary second element of a system provided herein. With regard to vision restoration, the second element can take the form of a prosthesis that includes a primary coil located either in an eyeglass lens frame or in a soft contact lens. The primary coil is used to inductively couple, for example, a radio frequency encoded image signal to a device containing a secondary coil that, in some embodiments, is implanted behind the iris of the eye (see, e.g., FIG. 5B). The power supply for the implant is obtained by rectification and filtering of the received radio-frequency signal. Digital data transmission to the implant is achievable by, for example, modulating the RF carrier signal. Reverse transmission can be implemented by varying the load seen by the secondary of the transformer.

Figure 5:
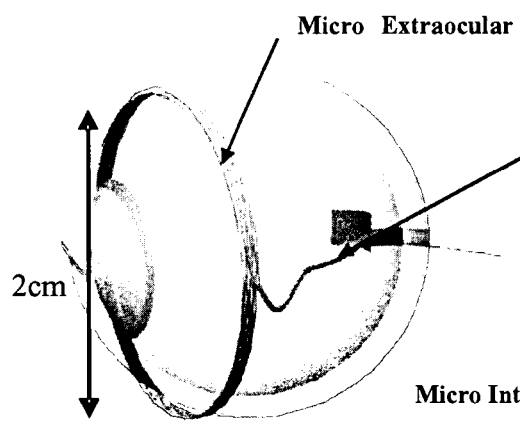
FIG. 5A depicts a system of the invention including an extra-ocular device.
FIG. 5B depicts a system of the invention including an intra-ocular device.
Figure 5:
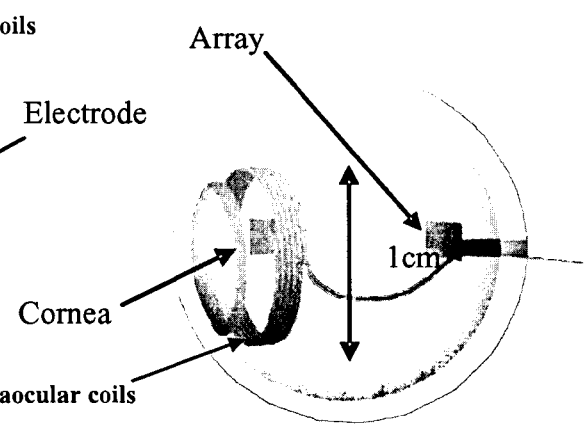

Referring again to FIG. 5A and FIG. 5B, the device containing the secondary coil (e.g., a micro extraocular coil or micro intraocular coil) can be operably linked to an electrode, such as a macular electrode. FIG. 5A and FIG. 5B show two components of a system of the invention, the first element (e.g., a device including a coil) and an electrode (e.g., a macular electrode) operably linked to an array, such as a retinal array associated with the retina of the eye. The first element optionally includes an integrated circuit that processes data received by the device before transmission to the electrode. In one aspect, the integrated circuit can be programmed to translate the details of a captured visual image into a pattern of stimulation. This pattern information may then be transferred to the retina via the electrode.

In addition, or in the alternative, the first element may include a retinal array interposed between the electrode and the retina. The retinal array is operably associated with the electrode and functionally associated with retinal tissue. Retinal arrays can be broadly divided into two categories: epi-retinal and sub-retinal. Epi-retinal devices are placed on or near the inner surface of the retina, e.g., the side which is first exposed to incoming light rays and along which the nerve fibers of the ganglion cells pass on their way to the optic nerve. Sub-retinal devices are placed under the retina, between the retina and the underlying retinal pigment epithelium or other deeper tissues. The retinal array may include an integrated circuit for translating the details of a captured visual image into a pattern of stimulation of the retina. A retinal array may obtain sufficient power from a device of the invention to both operate the electronics and stimulate the retina.

Accordingly, a retinal array can include intrinsic microcircuitry that could provide: 1) stimulus control in a manner that mimics natural retinal function; 2) stimulation that creates center-surround neural responses; 3) spatial filtering; 4) stimuli that generate retinal responses like those influenced by natural light-dark adaptation; 5) algorithmic commands as received from external sources; 6) stimuli that track movement of objects with the visual environment; 7) reverse telemetry of hardware and biological function, including but not limited to electrode resistance, temperature, pH, neural activity, presence neurotransmitters or other biochemicals; and 8) and other functions that would either contribute to creation of vision or monitor the safety or effectiveness of the implanted device.

The retinal array generally contains stimulating elements (e.g., microelectrodes) in, for example, a grid-like pattern. Optionally, the retinal array can contain light-sensitive elements, such as photodiodes, interlaced together with the stimulating elements. Such retinal arrays are discussed in more detail in U.S. Patent Application Pub. No. 2003/0158588, which is incorporated herein by reference, in its entirety. Alternatively, the light sensitive elements of a system of the invention can be positioned outside the eye. Accordingly, the light sensitive elements may be associated with a device worn externally by a subject. For example, the light sensitive elements may be mounted near the exterior RF primary coil (i.e., the secondary element), although such an arrangement is not required. The exterior RF coil, for example, may be mounted on the side of a pair of eyeglasses (or on a similarly placed supporting structure, or, in an alternate embodiment, under the skin) near and parallel to an implanted RF secondary coil. The primary coil can be driven by an external transmitter circuit carried by the subject.

In some embodiments a device of the invention, as incorporated in to a system of the invention, may receive only power from the primary coil and deliver only power to the other components of the primary element (e.g., integrated circuit(s), electrodes and/or retinal arrays). In this mode, a second "RF data" secondary coil can be included in a system of the invention. An RF data secondary coil can be manufactured according to the methods provided herein.

Alternatively, a single device of the invention, as incorporated in to a system of the invention, may receive power and image information (e.g., data). Generally a system of the invention will includes electronic circuitry for producing a set of electrical patterns in response to inputted image information. Subsequently, an electrical signal is conveyed to, for example, microelectrodes associated with a retinal array. The electronic circuitry may be included in the secondary element or the primary element of the system. The circuitry will generally include one or more transformation algorithms and parameters of the algorithms by which the optical pattern of the inputted image information is converted to a pattern of electrical stimulation that can be convey to the retina.

As previously noted, an exemplary system of the invention includes an external assembly (i.e., a second element) directly or indirectly attached to the body of the patient and an internal assembly (i.e., a first element) which is implanted in the patient. The internal assembly typically includes an internal coil, an electrode, and a retinal array positioned in or on the recipient's retina.

Collectively, the external coil and the internal coil form an inductively-coupled coil system for transcutaneous transfer of data and/or power. The transfer of energy via this system is controlled to effect the transmission of the electrical coded signals, referred to herein as stimulation signals, and power signals from an external image processing unit to the implanted unit. Once a stimulation signal has been transmitted to the implanted coil, it can be provided to an implanted integrated circuit which processes the signal and outputs one or more signals to the electrode which may apply the electrical stimulation directly to the retina of the recipient or directly to a retinal array associated with the retina of the recipient.

It is understood that the ocular implant system described above, and shown, in part, in FIGS. 5A and 5B, is exemplary only. A device provided herein may be included in any system that supports the use of a transceiver that includes a non-conductive polymeric material and a conductive material that generates an electromotive force when contacted with a modulated magnetic field, or generates a magnetic field when contacted with an electromotive force. The devices and systems provided herein are particularly well-suited for use in a biological environment, but they are not limited to such environments. For example, the array operably linked to the electrode can in principle be anything, such as living tissue, MEMS components, application-specific integrated circuits (ASICs), multi-electrode arrays or, as described above, a retinal array. Accordingly, a system of the invention provides a mechanism for the wireless transmission of power and data from a source (i.e., a second element) to a receiver (i.e., a first element), through an electrode and ultimately to an array capable of accepting electrical stimulation and/or digital data from the electrode.

In other embodiments, methods for fabricating a device of the invention are provided. The device is designed to be part of an inductively-coupled radio-frequency system that includes at least one secondary coil encased in a polymeric material. In one aspect, the device is implantable in a biological system. In one example, the biological system is an ocular system and the device resides either extraocularly or intraocularly. The device is considered to be an "implant" as long as it is intimately associated with a biological environment, such as ocular tissue. The device may be fashioned such that it conforms to the shape of the tissue in which implantation will occur. For example, the device may be fabricated to include a concave shape so that it conforms to the foveal pit of an eye.

The devices provided herein include a conductive material, such as a conductive polymer or metal, an a non-conductive material. The conductive material is completely or partially encapsulated in a non-conductive polymeric material such that it is protected from an environment, such as a biological environment, while maintaining the ability to receive data and power from an external source. Methods for manufacturing a such a device include deposition, pattern replication and etching processes known to those skilled in the art of fabricating MEMS devices and integrated circuits (IC). Exemplary methods of manufacturing devices and systems of the invention are discussed below.

Accordingly, in yet another embodiment, a method for manufacturing a multilayer device is provided. The method includes forming at least one layer of polymeric material on a solid substrate that may include one or more previously deposited layers of one or more materials. In some aspects, the polymeric material provides chemical resistance and provides a barrier to moisture and oxygen. The method further includes forming at least one layer of conductive material on a solid substrate that may include one or more previously deposited layers of one or more materials. In some aspects, the conductive material supports wireless data and power transmission. The method further includes selectively patterning the conductive material, and optionally selectively patterning the polymeric material. In some aspects, the operation of depositing and patterning can be repeated one or more times to build up a three-dimensional structure from a plurality layers. The method further includes removing the solid substrate. The resulting multilayer device is mechanically flexible. In addition, the conductive material is completely or partially encapsulated in the polymeric material.

In general, the conductive material generates an electromotive force when contacted with a modulated magnetic field. Alternatively, it may generate a magnetic field when contacted with an electromotive force.

As previously noted, the conductive material includes at least one of a conductive polymer, a metal, a silicon derivative, or combinations thereof. In some aspects, the conductive material includes at least one of a platinum, platinum grey, platinum black, gold, iridium, titanium, chromium, copper, aluminum, iridium oxide, chromium oxide, silver oxide, indium zinc oxide, indium tin oxide, silicon oxide, silicon nitride, silicon oxynitride, aluminum oxide, aluminum nitride, aluminum oxynitride, zinc oxide, indium oxide, tin oxide, cadmium tin oxide, cadmium oxide, magnesium oxide, and combinations thereof.

The conductive material can be formed by one of plasma deposition, physical vapor deposition, sputtering, or electroplating. Plasma deposition processes include, but are not limited to, plasma enhanced chemical vapor deposition, expanding thermal plasma, microwave plasma, inductively coupled plasma, or high density plasma chemical vapor deposition. The conductive material can be patterned by a liquid reagent or a gaseous reagent, such as plasma.

The polymeric material includes at least one of a parylene, an acrylic, a siloxane, xylene, an alkene, styrene, an organosilane, an organosilazane, an organosilicone, a PDMS (poly-di-methyl-siloxane) or a polyimide. In some aspects, the parylene is parylene N, parylene C, parylene D, parylene A, parylene AM, parylene F, parylene HT, or combinations thereof. The polymeric material can be formed by one of plasma deposition, physical vapor deposition, polymer monolithic layer deposition, or spin coating. The polymeric material can be patterned by a plasma liquid reagent, a gaseous reagent, laser ablation, or blade cutting.

The materials and techniques provided herein are uniquely suited to manufacturing a device that can be molded in to particular shapes. Heat treating a device manufactured by a method provided herein is one mechanism for molding such devices. Accordingly, manufacturing a device of the invention further includes heat treating the multilayer device to conform to a region of implantation in a biological environment.

Exemplary deposition and patterning processes are provided in FIGS. 2 and 3. Referring to FIG. 2 generally, a cross-sectional view of an exemplary method for metal-etch micro-fabrication of a device is provided. Referring to FIG. 2A, a sacrificial first layer of resist 20 is optionally deposited on a substrate 10. The deposition is optional because removal of the substrate subsequent to manufacture of the device can be accomplished by any suitable technique, including those that do not require the presence of a sacrificial layer between the substrate and the multilayer device. Accordingly, a first layer of polymeric material (e.g., parylene) 30 is deposited on the substrate 10 or the resist 20. A first layer of conductive material (e.g., conductive polymer, metal or silicon derivative) 40 is deposited on the layer of polymeric material 30. Referring to FIG. 2B, a second layer of resist 20 is deposited on conductive layer 40. The second layer of resist 20 is exposed and developed (e.g., patterned). Referring to FIG. 2C, the first conductive material layer 40 is etched according to the patterned resist 20 and the resist 20 is stripped. Referring to FIG. 2D, a second layer of polymeric material 30 is deposited on the etched conductive material 40 and a sacrificial third layer of resist 20 is deposited on the polymeric material 30. Referring to FIG. 2E, the third layer of resist 20 is exposed and developed. Referring to FIG. 2F, a pattern is transferred to the second layer of polymeric material 30 by plasma etching and the resist layer 20 is stripped. Referring to FIG. 2G, a second layer of conductive material 40 is deposited, and referring to FIG. 2H, a fourth layer of resist 20 is deposited, exposed and developed. Referring to FIG. 2I, the second layer of conductive material 40 is etched according to the pattern associated with the fourth layer of resist. Referring to FIG. 2J, a third layer of polymeric material 30 is deposited on the second layer of conductive material and a fourth layer of resist 20 is deposited, exposed and developed. Referring to FIG. 2K, the pattern is transferred to the polymeric material 30 by plasma etching. Referring to FIG. 2L, the substrate and first and fourth layers of resist are eliminated leaving a device 50 of the invention.

The term "substrate" 10 refers to any material upon which device processing may be performed, such as silicon. Materials can be deposited using conventional methods, such as, for example, chemical vapor deposition (CVD), plasma enhanced chemical vapor deposition (PECVD), spin coating, physical vapor deposition (PVD) among other deposition methods.

The polymeric material can include the following properties: a dielectric constant of about 2 to 4 at 60 Hz; an elongation break at about 10% to 300%; and a water absorption rate of about 0.01% to 0.10% per 24 hrs. In other embodiments, the polymeric material can include the following properties: a tensile strength of about 30 MPa to 80 MPa; and a gas permeability coefficient of about 0.50 to 2000 $cm^3$-mil/100 in 24 hr at 1 atm at 23° C.

"Patterning" is a process that defines regions for etching features. The feature may be, for example, a sub-micron feature. Referring to FIG. 2K, a feature 60 is extended into the polymeric material by etching the polymeric layer, using, for example, a reactive ion etch process. A suitable etchant may be selected based upon the composition of the polymeric layer. Exemplary etchants include fluorocarbons, hydrofluorocarbons, sulfur compounds, oxygen, nitrogen, carbon dioxide, etc. Generally the feature 60 is aligned with a conductive sub-layer 40 such that contact may be made thereto. For embodiments in which an optional etch stop layer has been formed atop the conductive sub-layer, the etch stop layer may be removed by a suitable etchant in order to expose the conductive sub-layer.

In another embodiment, "lift-off" based fabrication can be used to manufacture a device of the invention. In semiconductor fabrication, the term 'lift-off' refers to the process of creating patterns on the wafer surface through an additive process, as opposed to patterning techniques that involve subtractive processes, such as etching. Briefly, a pattern is defined on a substrate using resist. A film is blanket-deposited all over the substrate, covering the resist and areas in which the resist has been cleared. During the actual lifting-off, the resist under the film is removed with solvent, taking the film with it, and leaving only the film which was deposited directly on the substrate. Depending on the type of lift-off process used, patterns can be defined with extremely high fidelity and for very fine geometries. The skilled artisan will recognize that any deposited film can be lifted-off.

Referring specifically to FIG. 3A through FIG. 3P, the lift-off process can be employed to pattern the conductive material layer. Instead of the chemical etch process described above, a lift-off resist layer can first be spun and patterned, and the conductive material subsequently deposited. When the resist is removed, the conductive material remaining is in the pattern defined by the absence of the resist. Referring to FIG. 3 generally, a cross-sectional view of an exemplary method for lift-off micro-fabrication of a device is provided. Referring to FIG. 3A, a sacrificial first layer of resist 20 is deposited on a substrate 10. A first layer of non-conductive polymeric material (e.g., parylene) 30 is deposited on the resist 20. A second layer of resist 20 is deposited on the layer of polymeric material 30. Referring to FIG. 3B, the second layer of resist 20 is exposed and developed (e.g., patterned). Referring to FIG. 3C, a first conductive material layer 40 is deposited according to the patterned resist 20. Referring to FIG. 3D, the patterned layer of resist 20 is stripped. Referring to FIG. 3E, a second layer of polymeric material 30 is deposited on the first layer of conductive material and a third layer of resist 20 is deposited. Referring to FIG. 3F, the third layer of resist is exposed and developed. Referring to FIG. 3G, a pattern is transferred to the second layer of polymeric material 30 by plasma etching. Referring to FIG. 3H, the resist layer 20 is stripped. Referring to FIG. 3I, a fourth layer of resist is deposited. Referring to FIG. 3J, the resist 20 is patterned and developed. Referring to FIG. 3K, a second conductive material layer 40 is deposited according to the patterned resist 20. Referring to FIG. 3L, the fourth layer of resist is stripped. Referring to FIG. 3M, a third layer of polymeric material 30 is deposited on the second layer of conductive material and a fifth layer of resist 20 is deposited. Referring to FIG. 3N, the resist is patterned and developed. Referring to FIG. 3O, the pattern is transferred to the polymeric material 30 by plasma etching. Referring to FIG. 3P, the substrate and first and fifth layers of resist are eliminated leaving a device 50 of the invention.

Figure 4:
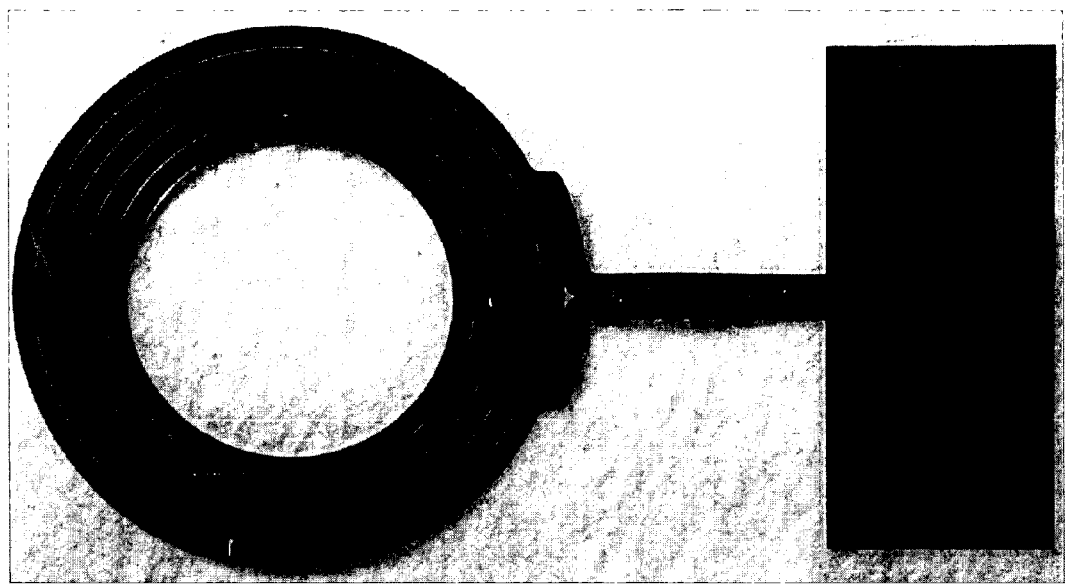
FIG. 4A depicts a device of the invention fabricated by methods provided herein.
FIG. 4B depicts a heat-formed device of the invention.
Figure 4:
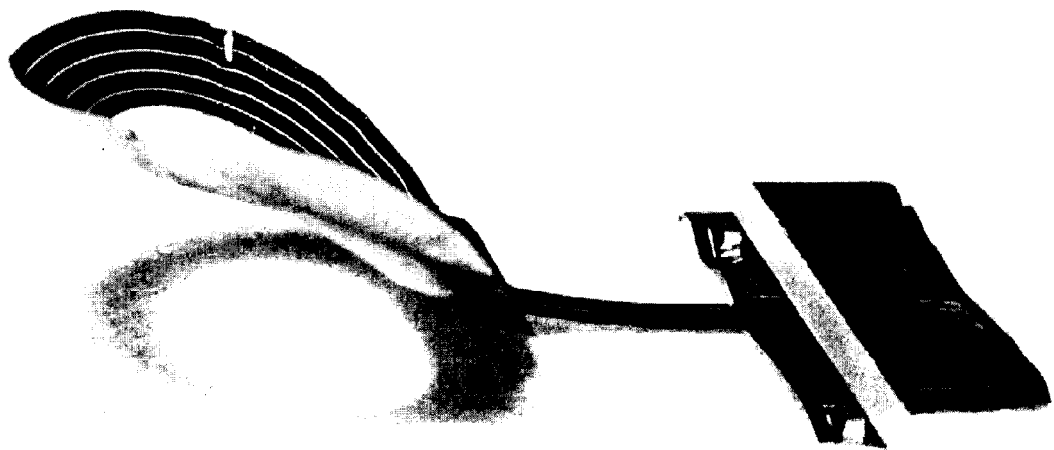

A device fabricated according to an "etch" or "lift-off" method described above can be heat formed using an existing mold because of the unique properties of the thin polymeric material and the conductive material. A fabricated device before and after heat-forming at 190° C. is shown in FIG. 4A and FIG. 4B, respectively. The process of heat forming the device is useful for molding the device to conform to a region of implantation in a biological environment. Thus, a microdevice of the invention can be contoured to fit a the tissue associated with a particular biological environment.

As used herein, the terms "micro electro mechanical systems/structures", "MEMS", "IMEMS", "micromachined structures" and any variations thereof, may generally be understood to comprise any miniature device combining, or otherwise capable of being suitably adapted to combine electrical and/or mechanical components that may be at least partially fabricated with batch-processing techniques. Moreover, the terms "MEMS", "IMEMS", "micromachined structures", "micro electro mechanical systems/structures" and any variations thereof may also be generally understood to comprise any miniature electromechanical device generally requiring at least temporary protection of spatially active elements during, for example, device packaging; whether such devices are now known or hereafter developed or otherwise described in the art. Such micro electro mechanical devices may be sealed or otherwise optionally configured for at least partial exposure to their operating environment; such as in the case of, for example, microsensor devices implanted in biological environments. Additionally, use of the term "microelectronic" may generally be understood to refer to any miniature electronic device and/or component that may or may not exhibit micro electro mechanical properties; for example, transistors of an IC element may be understood to comprise "microelectronic" devices that are generally not "micro electro mechanical" (i.e., IC transistors generally do not comprise spatially active elements) while RF MEMS switches may be understood to comprise "micro electro mechanical" devices that generally may also be classified as "microelectronic" in nature. Use of the term "plastic" is intended to include any type of flowable dielectric material. The term "film" may be used interchangeably with "coating" and/or "layer", unless otherwise indicated.

Micro electro mechanical systems (MEMS) emerged with the aid of the development of integrated circuit (IC) fabrication processes, in which sensors, actuators, and control functions are co-fabricated in silicon. As described above, surface micro-machining builds structures on the surface of the silicon by depositing thin films of 'sacrificial layers' and 'structural layers' and by removing eventually the sacrificial layers to release the mechanical structures. The dimensions of these surface micro-machined devices can be several orders of magnitude smaller than bulk-micromachined devices. In addition, silicon-based micromechanical devices can be integrated into microelectronic processing systems such as CMOS (Complementary Metal-Oxide-Semiconductor), as known to one of skill in the art.

Previous methods for producing hand-wound coils are not suitable for fabricating MEMS devices for implantation in, for example, a biological environment, because the size and rigidity of the coil contributes to tissue degradation in the region of implantation. Thus, previous mechanisms for micro-fabrication of MEMS devices are unlikely to produce devices containing RF coils that are suitable for use in biological systems. Accordingly, the devices and systems provided herein are designed to avoid fixed electrical connections through, for example, the skin into the body. The devices and systems presented here are designed for use with wireless power and data transmission implemented in practice through the use of an inductive link. A device of the invention can act as a receiver for implanted systems such as such as hearing aids, implantable pacemakers, defibrillators, functional electrical stimulation devices such as cochlear implants, ocular implants and other organ assist or replacement devices.

The examples set forth above are provided to give those of ordinary skill in the art a complete disclosure and description of how to make and use the embodiments of the devices, systems and methods of the invention, and are not intended to limit the scope of what the inventors regard as their invention. Modifications of the above-described modes for carrying out the invention that are obvious to persons of skill in the art are intended to be within the scope of the following claims. All patents and publications mentioned in the specification are indicative of the levels of skill of those skilled in the art to which the invention pertains. All references cited in this disclosure are incorporated by reference to the same extent as if each reference had been incorporated by reference in its entirety individually.

A number of embodiments of the invention have been described. Nevertheless, it will be understood that various modifications may be made without departing from the spirit and scope of the invention. Accordingly, other embodiments are within the scope of the following claims.

What is claimed is:

1. A device comprising:
   a) a polymeric material comprising the following properties:
      i) a dielectric constant of about 2 to 4 at 60 Hz;
      ii) an elongation break at about 10% to 300%;
      iii) a water absorption rate of about 0.01% to 0.10% per 24 hrs; and
   b) a conductive material
   wherein the conductive material is encapsulated in the polymeric material and wherein the device generates an electromotive force when contacted with a modulated magnetic field, or generates a magnetic field when contacted with an electromotive force.

2. The device of claim 1, wherein the device is suitable for association with a biological system.

3. The device of claim 1, wherein the polymeric material has a moisture vapor transmission rate of less than 2.0 g-mil/100 in 24 hr at 90% relative humidity and 37° C.

4. The device of claim 1, wherein the device has a thickness from about 0.05 micron to about 50 microns.

5. The device of claim 4, wherein the device has a thickness from about 0.1 micron to about 10 microns.

6. The device of claim 1, wherein the polymeric material comprises at least one of a parylene, an acrylic, a siloxane, xylene, an alkene, styrene, an organosilane, an organosilazane, an organosilicone, a PDMS (poly-di-methyl-siloxane) or a polyimide.

7. The device of claim 6, wherein the parylene is parylene N, parylene C, parylene D, parylene A, parylene AM, parylene F, parylene HT, or combinations thereof.

8. The device of claim 1, wherein the conductive material receives power and/or data from an external source by inductively coupled radio-frequency (RF) telemetry.

9. The device of claim 1, wherein the conductive material comprises at least one of a platinum, platinum grey, platinum black, gold, iridium, titanium, chromium, copper, aluminum, iridium oxide, chromium oxide, silver oxide, indium zinc oxide, indium tin oxide, silicon oxide, silicon nitride, silicon oxynitride, aluminum oxide, aluminum nitride, aluminum oxynitride, zinc oxide, indium oxide, tin oxide, cadmium tin oxide, cadmium oxide, magnesium oxide, and combinations thereof.

10. The device of claim 1 comprising multiple layers of the polymeric material.

11. The device of claim 1 comprising multiple layers of the conductive material.

12. The device of claim 1, wherein the device is a coil.

13. The device of claim 12, wherein the coil is an intraocular or extraocular coil.

14. The device of claim 12, wherein the device is contoured to conform to a region of implantation in a biological environment.

15. A system comprising:
   a) a first element comprising a device comprising a polymeric material comprising the following properties:
      i) a dielectric constant of about 2 to 4 at 60 Hz;
      ii) an elongation break at about 10% to 300%;
      iii) a water absorption rate of about 0.01% to 0.10% per 24 hrs; and
   a conductive material wherein the conductive material is encapsulated in the polymeric material and wherein the device generates an electromotive force when contacted with a modulated magnetic field, or generates a magnetic field when contacted with an electromotive force;
   b) a second element inductively linked to the first element, the second element comprising:
      i) a mechanism for generating a magnetic field that contacts the first element; and
      ii) a mechanism for generating radio frequency (RF) telemetry that contacts the first element;
   c) an electrode having a first end operably linked to the first element and a second end operably linked to an array.

16. The system of claim 15, wherein the first element is implanted in a biological system.

17. The system of claim 16, wherein the biological system is an eye.

18. The system of claim 15, wherein the device is a coil that receives data and power from the second element.

19. The system of claim 15, wherein the coil is an intraocular or extraocular coil.

20. The system of claim 15, wherein the first element comprises an integrated circuit.

21. The system of claim 15, wherein the second element is external to the biological system.

22. The system of claim 15, wherein the second element is a transmitter comprising a coil.

23. The system of claim 15, wherein the array is a retinal array.

24. The system of claim 23, wherein the retinal array is associated with nerve tissue.

25. The system of claim 24, wherein the nerve tissue comprises retinal tissue.

26. The system of claim 15, wherein the first element includes an amplifier.

27. The device of claim 1, wherein the polymeric material of a) comprises the following properties:
   iv) a tensile strength of about 30 MPa to 80 MPa;
   v) a gas permeability coefficient of about 0.50 to 2000 $cm^3$-mil/100 in 24 hr at 1 atm at 23° C.

28. The device of claim 27, wherein the gas is oxygen, nitrogen, carbon dioxide, hydrogen sulfide, sulphur dioxide or chlorine.

29. The device of claim 27, wherein the gas permeability coefficient for oxygen is less than 40 $cm^3$-mil/100 in 24 hr at 1 atm and at 23° C.

* * * * *